United States Patent
Ho et al.

(10) Patent No.: US 9,493,678 B2
(45) Date of Patent: Nov. 15, 2016

(54) POLISHING COMPOSITION

(71) Applicant: UWiZ Technology Co., Ltd., Zhongli (TW)

(72) Inventors: Yun Lung Ho, Zhongli (TW); Chun Chieh Lee, Zhongli (TW); Song Yuan Chang, Zhongli (TW); Ming Hui Lu, Zhongli (TW); Ming Che Ho, Zhongli (TW)

(73) Assignee: UWiZ Technology Co., Ltd., Zhongli (TW)

( * ) Notice: Subject to any disclaimer, the term of this patent is extended or adjusted under 35 U.S.C. 154(b) by 0 days.

(21) Appl. No.: 14/597,737

(22) Filed: Jan. 15, 2015

(65) Prior Publication Data

US 2016/0208141 A1 Jul. 21, 2016

(30) Foreign Application Priority Data

Nov. 10, 2014 (TW) .............. 103138930 A

(51) Int. Cl.
| | |
|---|---|
| *C09G 1/00* | (2006.01) |
| *C09G 1/02* | (2006.01) |
| *H01L 21/321* | (2006.01) |
| *H01L 21/3213* | (2006.01) |

(52) U.S. Cl.
CPC . *C09G 1/02* (2013.01); *C09G 1/00* (2013.01); *H01L 21/3212* (2013.01); *H01L 21/3213* (2013.01)

(58) Field of Classification Search
CPC ............ C09G 1/00; C09G 1/02; C09G 1/04; C09K 13/08; H01L 21/3212; H01L 21/3213; H01L 21/31051
See application file for complete search history.

(56) References Cited

U.S. PATENT DOCUMENTS

| | | | |
|---|---|---|---|
| 2005/0211953 A1* | 9/2005 | Jha | ........................ C09G 1/02 252/79.1 |
| 2008/0274619 A1 | 11/2008 | White et al. | |
| 2009/0224200 A1 | 9/2009 | Jha et al. | |
| 2010/0178768 A1* | 7/2010 | Li | ................................ 438/692 |
| 2011/0291188 A1 | 12/2011 | Cheng et al. | |
| 2012/0094491 A1* | 4/2012 | Kanamaru et al. | ........... 438/693 |
| 2012/0168913 A1 | 7/2012 | Toh et al. | |
| 2012/0190210 A1 | 7/2012 | Fujioto et al. | |
| 2015/0050862 A1* | 2/2015 | Serikawa | .......... H01L 21/02024 451/41 |

OTHER PUBLICATIONS

WO 99/6756 (PCT/US99/13709), Mravic et al., Composition for the chemical mechanical polishing of metal layers.*

* cited by examiner

*Primary Examiner* — Duy Deo
(74) *Attorney, Agent, or Firm* — Osha Liang LLP

(57) ABSTRACT

A polishing composition comprising abrasive particles, a compound having hexavalent molybdenum or pentavalent vanadium, an anionic additive, a halogen oxides compound or salts thereof, and a carrier solvent is provided herein. The polishing composition is suitable for chemical mechanical polishing process of SiGe, Si and $SiO_2$ substrates. The compound having hexavalent molybdenum or pentavalent can effectively raise the removal rate for SiGe and Si substrates, and increase the polishing selectivity of SiGe and Si relative to $SiO_2$, simultaneously.

9 Claims, No Drawings

POLISHING COMPOSITION

FIELD OF THE INVENTION

The present invention relates to a chemical mechanical polishing slurry composition, and in particular, to a polishing composition for polishing a silicon germanium alloy substrate.

BACKGROUND OF THE INVENTION

Recently, semiconductor manufacturing process has downed to the 16/14 nm scale, namely, advanced to the nodes below 10 nm, and adopting transistors with a three-dimensional structure, such as a fin-shaped field effect transistor (Fin-FET) with treating a group III-V and a germanium as its channel materials. Since the III-V group semiconductor wafer material can provide ten to thirty times higher electron mobility and the germanium provides more than four times higher hole mobility, than that of silicon material, whereby gate leakage current problem of the transistor can be effectively controlled, and the electron mobility can be raised, which can significantly enhance the chip operation performance, and at the same time reduce the power consumption. Therefore, various applications for the III-V group compounds, especially germanium (Ge), silicon-germanium (SiGe) and so forth are highly expected.

In sub-micron semiconductor manufacturing process, chemical mechanical polishing (CMP) is usually used to achieve global planarization on a wafer surface. However, in metal CMP technique, metal dishing, erosion, corrosion and other polishing flaws often occurred on a metal surface. To carry out the CMP to the above mentioned Fin-FET which adopted silicon-germanium as its primary material, for example, a Fin-FET structure published in US patent US 2011/0291188 A1 and US 2012/0168913 A1, silicon, silicon-germanium and silicon dioxide substrates thereof will be simultaneously grinded so that the removal ratio of the above-mentioned substrates will be restricted.

US Pat. US2012/0190210 A1 discloses that presently CMP slurry used for polishing silicon substrate usually contains ammonia-like pungent odor of ethylenediamine, other amines, or hydrofluoric acid which brings highly dangerous for human exposure. In view of this, it is necessary to develop a non-odor and hydrofluoric acid free polishing composition, which can effectively enhance the removal rate of silicon-containing substrate, and still does not cause severe corrosion to the grinding objects.

Please refer to Table 1, which is a chart of collecting contrast examples, with using a polishing composition consisting of hydrogen peroxide and ethylenediamine for polishing silicon-germanium substrate (the silicon-germanium substrate contents 10% to 80% of germanium), silicon substrate, and silicon dioxide substrate, wherein the hydrogen peroxide is used as an oxidant and the ethylenediamine functions as a catalyst. In general polishing applications, the oxidant is used to produce a easily removable oxide layer on the metal substrate, an inhibitor is configured to block the oxidation reaction, the catalyst is used to facilitate the removal of metal, and a surfactant is used to prevent abrasive particles from aggregating and to provide lubricating effect so as to reduce scratching defects, and a buffer is used to keep pH value stable at a nearly constant.

A Polishing test were conducted according to the following conditions. The result is recorded on Table 1.

Polishing machine: Mirra 8" Polish
Polishing pad: IC1010
Clean solution: deionized water
Wafer: SiGe blanket wafer, tetraethylortho silicate (TEOS) blanket wafer, bare silicon blanket wafer
Polishing time 1 min.
Head DF: 1.5 psi
Platen/head speed: 73/67 rpm

TABLE 1

| | $SiO_2$ content (wt %) | Hydrogen Peroxide (wt %) | Ethylenediamine (ppm) | Si R.R (Å/min) | SiGe R.R. (Å/min) | $SiO_2$ R.R. (Å/min) | SiGe SER (Å/min) |
|---|---|---|---|---|---|---|---|
| Contrast example 1 | 1 | 1 | 0 | 28 | 2450 | 12 | 503 |
| Contrast example 2 | 1 | 0 | 1000 | 42 | 10 | 28 | 0 |
| Contrast example 3 | 1 | 1 | 1000 | 45 | 2500 | 28 | 497 |
| Contrast example 4 | 1 | 1 | 5000 | 145 | 2520 | 20 | 489 |

In Table 1, a static etching rate (SER) of the silicon-germanium substrate is obtained by calculating the weight difference in a manner of placing a 3 cm×3 cm silicon-germanium substrate into the polishing composition for 5 minutes. As shown in the contrast examples 1-4 of table 1, adopting hydrogen peroxide as the oxidant can obtain a silicon-germanium removal rate (RR) greater than 2000 Å/min but a static etching rate near to 500 Å/min that may cause surface corrosion to the above mentioned substrates. Furthermore, adding ethylenediamine as the catalyst to enhance the removal rate of the silicon substrate is also limited. Therefore, using the hydrogen peroxide as the oxidant cannot effectively control the removal rate and the static etching rate of various substrates.

SUMMARY OF THE INVENTION

To resolve the aforementioned drawbacks, an invention objective of the present invention is to provide a polishing composition for polishing a silicon-germanium alloy substrate, which retains a greater silicon-germanium removal rate (RR) and a lower static etching rate, as effectively controlling the removal rate and the static etching rate for various substrates.

To achieve the invention objective, a polishing composition for polishing a silicon-germanium alloy substrate, according to the present invention, comprises: abrasive particles; a compound having hexavalent molybdenum or a pentavalent vanadium for carrying out a catalytic reaction and an oxidation reaction directly to the silicon-germanium alloy substrate; and a carrier solvent, wherein a content of the abrasive particles is in a range 0.01 wt % to 5 wt %, and a content of the compound having hexavalent molybdenum or pentavalent vanadium is in a range 0.01 wt % to 1.0 wt %.

According to another embodiment of the present invention, the polishing composition further comprises an anionic additive, wherein a content of which is in a range from 0.01 wt % to 1.0 wt %.

According to yet another embodiment of the present invention, the polishing composition further comprises a halogen oxides compound or salts thereof, wherein a content of the halogen oxides compound or salts thereof is in a range from 0.05 wt % to 5 wt %.

According to one embodiment of the present invention, the abrasive particles are selected from colloidal silica or fumed silica.

According to one embodiment of the present invention, the compound having hexavalent molybdenum or pentavalent vanadium is selected from the group consisting of molybdenum trioxide, molybdic acid, phosphomolybdic acid, vanadium pentoxide, sodium metavanadate, and sodium vanadate.

According to on embodiment of the present invention, the anionic additive is selected from the group consisting of potassium fluoride, sodium fluoride, ammonium fluoride, trifluoroacetic acid, potassium trifluoroacetate, and sodium trifluoroacetate.

According to one embodiment of the present invention, the halogen oxides compound or salts thereof is selected from the group consisting of potassium periodate, potassium iodate, potassium perchlorate, sodium perchlorate, potassium chlorate, sodium chlorate, and sodium hypochlorite.

According to one embodiment of the present invention, the carrier solvent comprises water.

According to one embodiment of the present invention, the polishing composition has a pH value in a range of 7 to 12.

According to one embodiment of the present invention, the polishing composition is used for a chemical mechanical polishing to silicon-germanium substrate, silicon substrate, and the silicon dioxide substrate. And a content of germanium in the silicon-germanium substrate is in a range from 10% to 80%.

According to the above embodiments of the present invention, wherein a static etching rate of the silicon-germanium substrate is 0 Å/min.

BRIEF DESCRIPTION OF THE DRAWINGS

None

DETAILED DESCRIPTION OF THE PREFERRED EMBODIMENTS

For a better understanding of the aforementioned content of the present invention, preferable embodiments are illustrated in accordance with the attached figures as follows. The patentable scope of the present invention is not limited to these embodiments; it should be defined by the claims.

The present invention provides a polishing composition comprising: abrasive particles; a compound having hexavalent molybdenum compound or pentavalent vanadium; and a carrier solvent. The abrasive particles are principle component of the polishing composition, and are commonly seen of silica particles ($SiO_2$) and alumina particles ($Al_2O_3$), etc., wherein the silica particles can be divided into colloidal silica and fumed silica. The alumina particles typically have higher hardness, which may easily cause metal wire defects such as scratches after a planarization process. Therefore, according to one embodiment of the present invention, the abrasive particles are selected from colloidal silica or fumed silica.

Moreover, abrasive particle concentration is also an important factor for wafer polishing, if the concentration of the abrasive particles is too high, the effect of mechanical polishing will be accelerated, thus it is easily to cause polishing defects such as erosion on the surface, and an exorbitant removal rate of a silicon dioxide substrate which led to a low selectivity ratio; on the other hand, if the concentration of the abrasive particles is too low, it is disadvantageous to the mechanical polishing and the desired removal rate cannot be achieved. Thus, in one embodiment of the present invention, a content of the abrasive particles presented in the carrier solvent solution is in a range from 0.01 wt % to 5 wt %, wherein the carrier solvent is deionized water or other solutions containing water.

The compound (M) having hexavalent molybdenum or pentavalent vanadium has oxidation capability, which can conduct a chemical insertion reaction by inserting itself into Si—Si bond of a silicon substrate to break the Si—Si bond, and forming a formation of Si-M-Si, after that, making use of its own oxidation ability to oxidize the Si-M-Si formation into $SiO_2$, so as to achieve the purpose of removal. Since the above reaction of breaking the Si—Si bond is called rate determining step, so that the compound having hexavalent molybdenum or pentavalent vanadium is also referred as a metal catalyst for enhancing the removal rate and selectivity ratio between the substrates. The compound having hexavalent molybdenum or pentavalent vanadium is selected from the group consisting of molybdenum trioxide, molybdic acid, phosphomolybdic acid, vanadium pentoxide, sodium metavanadate, and sodium vanadate, but is not limited to. Furthermore, the compound having hexavalent molybdenum or pentavalent vanadium relative to the total weight of the polishing composition is 0.01 wt % to 1.0 wt %.

Embodiments 1-17

Please refer to the following Table 2, which collects embodiments for polishing silicon-germanium substrate (content of germanium in the silicon-germanium substrate is in a range from 10% to 80%), silicon substrate, and silicon dioxide substrate by using the polishing composition as described above of the present invention. The polishing conditions for the embodiments are the same as that of the contrast examples in Table 1, which will not be described herein.

TABLE 2

|  | SiO$_2$ content (wt %) | Vanadium pentoxide (ppm) | pH | Si R.R. (Å/min) | SiGe R.R. (Å/min) | SiO$_2$ R.R. (Å/min) | SiGe SER (Å/min) |
|---|---|---|---|---|---|---|---|
| Embodiment 1 | 1 | 0 | 10 | 25 | 15 | 10 | 0 |
| Embodiment 2 | 1 | 100 | 10 | 100 | 40 | 12 | 0 |
| Embodiment 3 | 1 | 500 | 10 | 350 | 95 | 15 | 0 |
| Embodiment 4 | 1 | 1500 | 10 | 685 | 158 | 18 | 0 |
| Embodiment 5 | 1 | 3000 | 10 | 782 | 256 | 19 | 0 |
| Embodiment 6 | 1 | 5000 | 10 | 801 | 271 | 17 | 0 |
| Embodiment 7 | 1 | 10000 | 10 | 810 | 282 | 20 | 0 |
| Embodiment 8 | 1 | 3000 | 7.0 | 790 | 249 | 16 | 0 |
| Embodiment 9 | 1 | 3000 | 12 | 771 | 280 | 21 | 0 |

|  | SiO$_2$ content (wt %) | Molybdenum trioxide (ppm) | PH | Si R.R. (Å/min) | SiGe R.R. (Å/min) | SiO$_2$ R.R. (Å/min) | SiGe SER (Å/min) |
|---|---|---|---|---|---|---|---|
| Embodiment 10 | 1 | 100 | 10 | 105 | 55 | 11 | 0 |
| Embodiment 11 | 1 | 500 | 10 | 401 | 100 | 15 |  |
| Embodiment 12 | 1 | 1500 | 10 | 638 | 240 | 15 | 0 |
| Embodiment 13 | 1 | 3000 | 10 | 842 | 250 | 16 | 0 |
| Embodiment 14 | 1 | 5000 | 10 | 863 | 258 | 17 | 0 |
| Embodiment 15 | 1 | 10000 | 10 | 869 | 260 | 19 | 0 |
| Embodiment 16 | 1 | 5000 | 7.0 | 858 | 269 | 13 | 0 |
| Embodiment 17 | 1 | 5000 | 12 | 873 | 263 | 15 | 0 |

As shown in embodiments 1-9 of Table 2, in an alkaline environment, when a concentration of the catalyst, vanadium pentoxide (pentavalent vanadium) is in a range of 100~40000 ppm, it is capable to raise the removal rate of silicon, and slightly increases the removal rate of silicon-germanium; however, as the concentration of the vanadium pentoxide increases to a certain level, the removal rates of silicon-germanium and silicon are gradually slowed down, while the polishing composition does not significantly affect the removal rate of the silicon dioxide.

As shown in embodiments 10-17, in an alkaline environment, when a concentration of the catalyst, molybdenum trioxide (hexavalent molybdenum) is in a range of 100~40000 ppm, it is capable to raise the removal rate of silicon, and slightly increases the removal rate of silicon-germanium. The alkaline environment herementioned is specifically in a pH scale ranging from 7 to 12.

Thus, compared to the contrast examples 1-4, the compound having hexavalent molybdenum or pentavalent vanadium added in the polishing composition can significantly raise the removal rate of silicon, and at the same time increase the polishing selectivity of silicon-germanium and silicon relative to silicon dioxide.

Embodiments 18-25

In another embodiment of the present invention, the polishing composition may also comprise: abrasive particles, anionic additive, and a carrier solvent. Where the abrasive particles relative to the total weight of the polishing composition are 0.01 wt % to 5 wt %, and are selected from colloidal silica or fumed silica; the anionic additive is selected from the group consisting of potassium fluoride, sodium fluoride, ammonium fluoride, trifluoroacetic acid, potassium trifluoroacetate, and sodium trifluoroacetate, but is not limited to. Preferably, the anionic additive relative to the total weight of the polishing composition is 0.01 wt % to 1.0 wt %.

Please refer to Table 3, which collects another embodiments for polishing silicon-germanium substrate (content of germanium in the silicon-germanium substrate is in a range from 10% to 80%), silicon substrate, and silicon dioxide substrate by using the polishing composition as described above of the present invention. The polishing conditions for the embodiments are the same as that of the contrast examples in Table 1, which will not be described herein.

TABLE 3

|  | SiO$_2$ content (wt %) | Potassium fluoride (ppm) | Trifluoroacetate (ppm) | pH | Si R.R. (Å/min) | SiGe R.R. (Å/min) | SiO$_2$ R.R. (Å/min) | SiGe SER (Å/min) |
|---|---|---|---|---|---|---|---|---|
| Embodiment 18 | 1 | 100 | 0 | 10 | 55 | 22 | 13 | 0 |
| Embodiment 19 | 1 | 2000 | 0 | 10 | 145 | 30 | 11 | 0 |
| Embodiment 20 | 1 | 5000 | 0 | 10 | 151 | 33 | 12 | 0 |
| Embodiment 21 | 1 | 10000 | 0 | 10 | 174 | 35 | 15 | 0 |
| Embodiment 22 | 1 | 0 | 100 | 10 | 50 | 25 | 13 | 0 |
| Embodiment 23 | 1 | 0 | 2000 | 10 | 98 | 28 | 11 | 0 |
| Embodiment 24 | 1 | 0 | 5000 | 10 | 102 | 29 | 10 | 0 |
| Embodiment 25 | 1 | 0 | 10000 | 10 | 120 | 33 | 14 | 0 |

Since the anionic additive and the silicon have a stronger attractive force, a strong Si—F bond is therefore generated between the silicon and the anionic additive, such as fluoride ions of potassium fluoride listed in Table 3, so that the anionic additive can further assist the silicon substrate to break the Si—Si bond and achieve the removal purpose. As shown in the embodiments 18-25 of Table 3, in an alkaline environment, when a concentration of the anionic additive, potassium fluoride or trifluoroacetate is in a range of 100~10000 ppm, it is capable to raise the removal rates of silicon and silicon-germanium, while the polishing composition does not significantly affect the removal rate of silicon dioxide.

In comprehensive view of the above embodiments 1-25, the compound having hexavalent molybdenum or pentavalent vanadium, and the anionic additive both can improve the removal rates of silicon and silicon-germanium; however, the removal rates of silicon-germanium and silicon gradually slowed down as the concentration of the compound having hexavalent molybdenum or pentavalent vanadium, and the anionic additive increase.

Embodiments 26-34

In yet another embodiment of the present invention, aside from the abrasive particles and the carrier solvent, the polishing composition may simultaneously contain the compound having hexavalent molybdenum or pentavalent vanadium and the anion additive. The abrasive particles are selected from colloidal silica or fumed silica, and preferably, relative to the total weight of the polishing composition are 0.01 wt % to 5 wt %; the compound having hexavalent molybdenum or pentavalent vanadium is selected form the group consisting of molybdenum trioxide, molybdic acid, phosphomolybdic acid, vanadium pentoxide, sodium metavanadate, and sodium vanadate, but is not limited to, The compound having hexavalent molybdenum or pentavalent vanadium, and the anionic additive relative to the total weight of the polishing composition are preferably, 0.01 wt % to 1.0 wt %.

Please refer to Table 4, which collects still yet another embodiments for polishing silicon-germanium substrate (content of germanium in the silicon-germanium substrate is 10 to 80%), silicon substrate, and silicon dioxide substrate by using the polishing composition as described above of the present invention. The polishing conditions for the embodiments are the same as that of the contrast examples in Table 1, which will not be described herein.

As shown in the embodiments 26-35 of Table 4, when a 1500 ppm of vanadium pentoxide or molybdenum trioxide (as the metal catalyst) mix with a 100~10,000 ppm of potassium fluoride or a 2000 ppm of trifluoroacetic acid (as the anionic additive), in an alkaline environment, the polishing composition can further raise the removal rate of silicon and silicon-germanium, while it does not significantly affect the removal rate of the silicon dioxide. As shown in Table 4, as the concentration of vanadium pentoxide and the potassium fluoride increase to a certain level, the removal rates of silicon-germanium and silicon are gradually slowed down, however, the removal rate of the silicon dioxide has not significantly affected.

Embodiments 36-53

Since in Table 4, the removal rate of silicon-germanium is still low, and therefore, in still yet another embodiment of the present invention, aside from the abrasive particles, the carrier solvent, the compound having hexavalent molybdenum or pentavalent vanadium, and the anionic additive, the polishing composition may further comprises a halogen oxides compound or salts thereof, which is selected from the group consisting of potassium periodate, potassium iodate, potassium perchlorate, sodium perchlorate, potassium chlorate, sodium chlorate, and sodium hypochlorite, but is not limited to. A concentration of the halogen oxides compound relative to the total weight of the polishing composition is, for example, from 0.05 wt % to 5 wt %.

Please refer to Table 5, which collects still yet another embodiments for polishing silicon-germanium substrate (content of germanium in the silicon-germanium substrate is 10 to 80%), silicon substrate, and silicon dioxide substrate by using the polishing composition as described above of the present invention. The polishing conditions for the embodiments are the same as that of the contrast examples in Table 1, which will not be described herein.

TABLE 4

| | $SiO_2$ content (w.t %) | Vanadium pentoxide (ppm) | Potassium fluoride (ppm) | Molybdenum trioxide (ppm) | Trifluoroacetate (ppm) | pH | Si R.R. (Å/min) | SiGe R.R. (Å/min) | $SiO_2$ R.R. (Å/min) | SiGe SER (Å/min) |
|---|---|---|---|---|---|---|---|---|---|---|
| Embodiment 26 | 1 | 100 | 2000 | 0 | 0 | 10 | 200 | 80 | 15 | 0 |
| Embodiment 27 | 1 | 1500 | 2000 | 0 | 0 | 10 | 932 | 301 | 17 | 0 |
| Embodiment 28 | 1 | 5000 | 2000 | 0 | 0 | 10 | 995 | 370 | 22 | 0 |
| Embodiment 29 | 1 | 10000 | 2000 | 0 | 0 | 10 | 1040 | 375 | 25 | 0 |
| Embodiment 30 | 1 | 1500 | 100 | 0 | 0 | 10 | 700 | 170 | 20 | 0 |
| Embodiment 31 | 1 | 1500 | 5000 | 0 | 0 | 10 | 935 | 320 | 24 | 0 |
| Embodiment 32 | 1 | 1500 | 10000 | 0 | 0 | 10 | 940 | 350 | 22 | 0 |
| Embodiment 33 | 1 | 1500 | 0 | 0 | 2000 | 10 | 726 | 203 | 19 | 0 |
| Embodiment 34 | 1 | 0 | 2000 | 1500 | 0 | 10 | 922 | 339 | 18 | 0 |
| Embodiment 35 | 1 | 0 | 0 | 1500 | 2000 | 10 | 752 | 298 | 12 | 0 |

TABLE 5

| | SiO$_2$ content (wt %) | Vanadium pentoxide (ppm) | Potassium fluoride (ppm) | Potassium iodate (ppm) | pH | Si R.R. (Å/min) | SiGe R.R. (Å/min) | SiO$_2$ R.R. (Å/min) | SiGe SER (Å/min) |
|---|---|---|---|---|---|---|---|---|---|
| Embodiment 36 | 1 | 1500 | 2000 | 5000 | 10 | 1103 | 950 | 25 | 0 |
| Embodiment 37 | 1 | 1500 | 2000 | 10000 | 10 | 1321 | 1011 | 22 | 0 |
| Embodiment 38 | 1 | 1500 | 2000 | 500 | 10 | 1180 | 370 | 24 | 0 |
| Embodiment 39 | 1 | 1500 | 2000 | 50000 | 10 | 1200 | 1800 | 26 | 0 |
| Embodiment 40 | 1 | 1500 | 2000 | 5000 | 7.0 | 1089 | 963 | 22 | 0 |
| Embodiment 41 | 1 | 1500 | 2000 | 5000 | 12 | 1158 | 932 | 18 | 0 |
| Embodiment 42 | 0.01 | 1500 | 2000 | 10000 | 10 | 120 | 380 | 5 | 0 |
| Embodiment 43 | 3 | 1500 | 2000 | 10000 | 10 | 2111 | 1401 | 185 | 0 |
| Embodiment 44 | 5 | 1500 | 2000 | 10000 | 10 | 3512 | 1723 | 403 | 0 |

| | SiO$_2$ content (wt %) | Molybdenum trioxide (ppm) | Potassium fluoride (ppm) | Sodium hypochlorite (ppm) | pH | Si R.R. (Å/min) | SiGe R.R. (Å/min) | SiO$_2$ R.R. (Å/min) | SiGe SER (Å/min) |
|---|---|---|---|---|---|---|---|---|---|
| Embodiment 45 | 1 | 1500 | 2000 | 1000 | 10 | 1108 | 850 | 30 | 0 |
| Embodiment 46 | 1 | 1500 | 2000 | 5000 | 10 | 1268 | 1276 | 31 | 0 |
| Embodiment 47 | 1 | 1500 | 2000 | 500 | 10 | 950 | 451 | 30 | 0 |
| Embodiment 48 | 1 | 1500 | 2000 | 50000 | 10 | 1375 | 1788 | 35 | 0 |
| Embodiment 49 | 1 | 1500 | 2000 | 1000 | 7.0 | 1050 | 831 | 29 | 0 |
| Embodiment 50 | 1 | 1500 | 2000 | 1000 | 12 | 1201 | 870 | 34 | 0 |
| Embodiment 51 | 0.01 | 1500 | 2000 | 5000 | 10 | 118 | 400 | 6 | 0 |
| Embodiment 52 | 3 | 1500 | 2000 | 5000 | 10 | 2207 | 1378 | 198 | 0 |
| Embodiment 53 | 5 | 1500 | 2000 | 5000 | 10 | 3410 | 1683 | 451 | 0 |

In the embodiments 36-53, a 500~50000 ppm of potassium iodate or sodium hypochlorite (as the oxidant) is further added to the carrier solvent, which has a 1500 ppm of vanadium pentoxide or trioxide (as the metal catalyst), and a 2000 ppm of potassium fluoride (as the anionic additive). As shown in Table 5, the presence of the oxidant can further raise the removal rate of silicon, and significantly increase the removal rate of silicon-germanium. A zero static etching rate is obtained, even when pH value changes from 7 to 12, the removal rates of silicon, silicon-germanium and silicon dioxide still remain close. In addition, the embodiments 42-44 and 51-53 further show that, the removal rates of silicon, silicon-germanium, and silica dioxide increase as the concentration of the abrasive particles increase.

Compared the above contrast examples with embodiments, we can know that the oxidant, halogen oxides compound can oxide silicon substrate and silicon-germanium substrate, so as to form an oxidation layer to facilitate the removal rates, with the presence of the anionic additive and the compound having hexavalent molybdenum or pentavalent vanadium, can elastically adjust the removal ratio of silicon substrate, silicon-germanium substrate, and silicon dioxide substrate. For example, in the embodiment 31, a selectivity of silicon relative to silicon dioxide is 60:1; a selectivity of silicon-germanium relative to silicon dioxide is 45:1; and a selectivity of silicon relative to silicon-germanium is 1.3:1. The polishing composition of the present invention has high selectivity of silicon-germanium substrate relative to silicon dioxide, and a high selectivity of silicon substrate relative to silicon dioxide. Also, the selectivity can be adjusted upon practical demands, therefore the polishing composition can be regarded as the polishing demand of the Fin-FET which adopted silicon-germanium as the primary material.

The polishing composition of the present invention preforms excellent effects on the removal rate, the relative selectivity of silicon and silicon-germanium, with zero static etching rate. Besides, pH value of the polishing composition of the present invention is controlled in the range from 7 to 12, therefore the anionic additive will not produce hydrofluoric acid which is harmful to human body. When the polishing composition is used for polishing silicon-germanium alloy substrate, the hazard of chemicals on human and environmental can be reduced.

The embodiments were chosen and described in order to explain the principles of the disclosure and their practical application so as to activate others skilled in the art to utilize the disclosure and various embodiments and with various modifications as are suited to the particular use contemplated. Alternative embodiments will become apparent to those skilled in the art to which the present disclosure pertains without departing from its spirit and scope. Accordingly, the scope of the present invention is defined by the appended claims rather than the foregoing description and the exemplary embodiments described therein.

What is claimed is:

1. A polishing composition for polishing a silicon-germanium alloy substrate, comprising:
    abrasive particles;
    a compound selected from the group consisting of vanadium pentoxide and sodium metavanadate, for carrying out a catalytic reaction and an oxidation reaction directly to the silicon-germanium alloy substrate; and
    a carrier solvent, wherein a content of the abrasive particles is in a range from 0.01 wt % to 5 wt %, and a content of the compound having hexavalent molybdenum or pentavalent vanadium is in a range from 0.01 wt % to 1.0 wt %;
    wherein the polishing composition further comprises an anionic additive, and a content of which is in a range from 0.01 wt % to 0.2 wt %;
    wherein the polishing composition further comprises a halogen oxides compound of salts thereof, and a content of the halogen oxides compound or salts thereof is in a range from 0.05 wt % to 5 wt %; and
    wherein a static etching rate of the silicon-germanium substrate is 0 Å/min.

2. The polishing composition as claimed in claim 1, wherein the abrasive particles are selected from colloidal silica or fumed silica.

3. The polishing composition as claimed in claim 1, wherein the anionic additive is selected from the group consisting of potassium fluoride, sodium fluoride, trifluoroacetic acid, potassium trifluoroacetate, and sodium trifluoroacetate.

4. The polishing composition as claimed in claim 1, wherein the halogen oxides compound or salts thereof is selected from the group consisting of potassium perchlorate, sodium perchlorate, potassium chlorate, and sodium chlorate.

5. The polishing composition as claimed in claim 1, wherein the carrier solvent comprises water.

6. The polishing composition as claimed in claim 1, wherein the polishing composition has a pH value in a range of 7 to 12.

7. The polishing composition as claimed in claim 1, wherein the polishing composition is used for a chemical mechanical polishing to a silicon-germanium substrate, a silicon substrate, and a silicon dioxide substrate.

8. The polishing composition as claimed in claim 7, wherein a content of germanium in the silicon-germanium substrate is in a range from 10% to 80%.

9. A polishing composition for polishing a silicon-germanium alloy substrate, consisting essentially of: abrasive particles; a compound selected from the group consisting of vanadium pentoxide and sodium metavanadate, for carrying out a catalytic reaction and an oxidation reaction directly to the silicon-germanium alloy substrate; and a carrier solvent, wherein a content of the abrasive particles is in a range from 0.01 wt % to 5 wt %, and a content of the compound having hexavalent molybdenum or pentavalent vanadium is in a range from 0.01 wt % to 1.0 wt %; wherein the polishing composition further comprises an anionic additive, and a content of which is in a range from 0.1 wt % to 0.2 wt %; wherein the polishing composition further comprises a halogen oxides compound or salts thereof, and a content of the halogen oxides compound or salts thereof is in a range from 0.05 wt % to 5 wt %.

* * * * *